| (12) | United States Patent | (10) Patent No.: | US 7,456,470 B2 |
|---|---|---|---|
| | Jones | (45) Date of Patent: | Nov. 25, 2008 |

(54) TOP DRAIN FET WITH INTEGRATED BODY SHORT

(75) Inventor: David Paul Jones, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/238,207

(22) Filed: Sep. 29, 2005

(65) Prior Publication Data

US 2006/0113589 A1 Jun. 1, 2006

Related U.S. Application Data

(60) Provisional application No. 60/615,447, filed on Oct. 1, 2004.

(51) Int. Cl.
*H01L 27/108* (2006.01)

(52) U.S. Cl. ........................ 257/331; 257/329; 257/330; 257/332; 257/341; 257/E27.091; 257/E29.201; 257/E29.257; 257/E29.26

(58) Field of Classification Search ................. 257/329, 257/330, 331, 341, 263, 332, E27.091, E29.201, 257/E29.257, E29.26
See application file for complete search history.

(56) References Cited

U.S. PATENT DOCUMENTS

| 5,134,448 | A | 7/1992 | Johnsen et al. ............. 357/23.4 |
| 6,509,608 | B1 * | 1/2003 | Hueting ...................... 257/330 |
| 6,906,380 | B1 * | 6/2005 | Pattanayak et al. .......... 257/331 |
| 2006/0220093 | A1 * | 10/2006 | Van Schaijk et al. ........ 257/315 |

* cited by examiner

*Primary Examiner*—Matthew C. Landau
*Assistant Examiner*—Jay C Kim
(74) *Attorney, Agent, or Firm*—Ostrolenk, Faber, Gerb & Soffen, LLP

(57) ABSTRACT

A top drain MOSgated device has its drain on the top of semiconductor die and its source on the bottom of the die substrate. Parallel spaced trenches extend from the die top surface through a drift region, a channel region and terminate on the substrate region. The bottoms of each trench receive a silicide conductor to short the substrate source to channel regions. The silicide conductors are then insulated at their top surfaces and gate electrodes are placed in the same trenches as those receiving the channel/source short.

5 Claims, 5 Drawing Sheets

TOP DRAIN FET WITH INTEGRATED BODY SHORT

RELATED APPLICATIONS

This application claims the benefit and priority of U.S. Provisional Application No. 60/615,447, filed Oct. 1, 2004 the entire disclosure of which is incorporated by reference herein.

This invention is also related to application IR-2751 entitled TOP DRAIN MOSGATED DEVICE AND PROCESS OF MANUFACTURE THEREFOR, U.S. Ser. No. 11/217,870, filed Sep. 1, 2005 in the names of Daniel M. Kinzer, David Paul Jones and Kyle Spring the subject matter of which is incorporated herein by reference.

FIELD OF THE INVENTION

This invention relates to power MOSGATED devices and more specifically to such devices in which the drain is atop the junction-receiving surface of a semiconductor die.

BRIEF DESCRIPTION OF THE INVENTION

Power MOSFETs in which the device drain is on top of the junction-receiving surface of the semiconductor die or wafer are well known. Such devices must have a means for shorting the source to body junction which is disposed deeply within the top surface of the die. One way of making this junction available has been to form a dedicated trench which extends to the body junction and then forming a conductive short at the trench bottom. This uses die area since it requires a polysilicon gate trench and a separate spaced shorting trench for each cell (or stripe) of the device.

In accordance with the present invention, the source to body short is formed at the bottom of the gate trench, thus permitting a higher density of gate trenches in a trench type power MOSGATED device. Preferably, the shorting material is a conductive silicide at the trench bottom which is a portion of an interrupted silicide layer over the gate polysilicon and drain.

BRIEF DESCRIPTION OF THE INVENTION

DETAILED DESCRIPTION OF THE PREFERRED EMBODIMENTS

Figure 1:
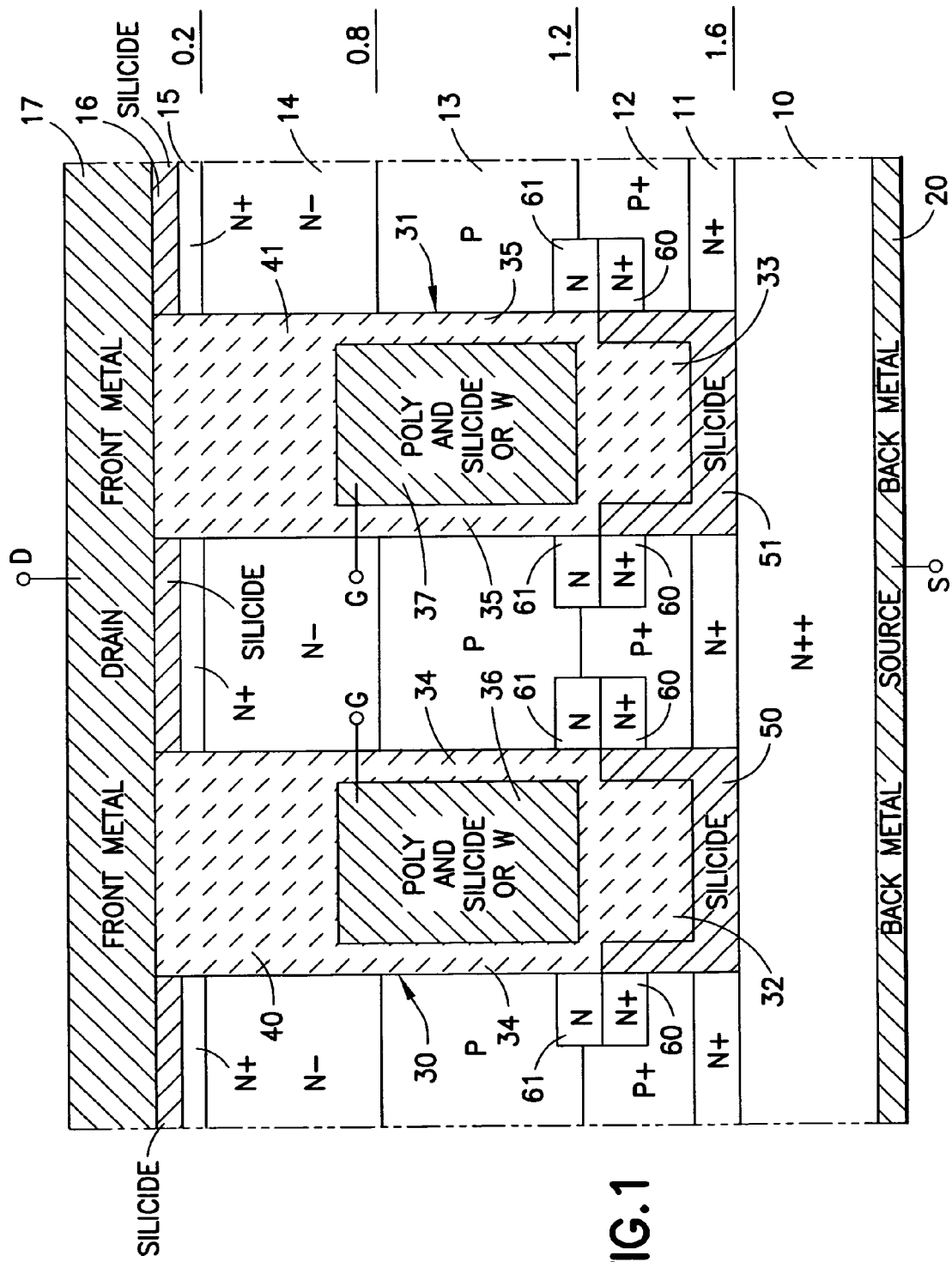
FIG. 1 is a cross-section of a small portion of a trench device in accordance with the invention, showing two adjacent gate trenches in which a silicide coating shorts together the P/P+ base (or channel) region and the bottom N/N+ source at the bottom of each gate trench.

Referring first to FIG. 1, there is shown, in cross-section, two adjacent "cells", which may be elongated or enclosed in a semiconductor die and constructed in accordance with the invention, and in which the source to body junction is at the bottom of each gate trench.

Thus, in FIG. 1, the device shown has an N++ substrate 10 which has a thin N+ type layer 11 thereon. A P+ layer 12 is formed atop layer 11 and a P channel layer 13 is formed atop layer 12. An N− drift region 14 is formed atop layer 13 and an N+ drain contact layer 15 is formed atop layer 14. A conductive silicide layer 16 is disposed atop layer 15 and a front drain metal 17 is disposed atop and in contact with silicide layer 16. Note that a back source metal 20 is deposited on the bottom of body 10. An N channel device is shown. The conductivity types may be reversed to form a P channel device.

Two gate trenches, among a large number of other identical trenches, are formed in the wafer, shown as trenches 30 and 31. Trenches 30 and 31 receive insulation oxides such as bottom oxide segments 32 and 33 respectively and are lined with gate oxides 34 and 35 respectively. Conductive gate masses 36 and 37 respectively of polysilicon or the like are disposed in trenches 30 and 31 and are operable upon the application of a suitable potential between gates 36 and 37 and drain 17 to invert the channel regions opposite to gate oxides 34 and 35 to turn on the device between top drain 17 and bottom source 20.

Note that all gates 36, 37 are suitably connected together in any desired manner (not shown). Note further that the trenches 30 and 31 are filled above the poly masses 36 and 37 by oxide fillers and caps 40 and 41.

It is necessary to short circuit the parasitic N/P/N transistor formed by N region 14; P region 13; and N region 10 to prevent the turn on of this bipolar device. In accordance with the invention, this short is provided at the bottom of each trench 30 and 31. Thus, conductive silicide shorts 50 and 51 are formed in the bottom of trenches 30 and 31 respectively, electrically connecting source regions 10 and 11 to the P+ channel extension from channel region 13.

This short is improved by the provision of N+ and N contact regions 60 and 61 respectively.

FIGS. 2 to 5 show a second embodiment of the invention, along with a novel process for the device fabrication.

Figure 2:
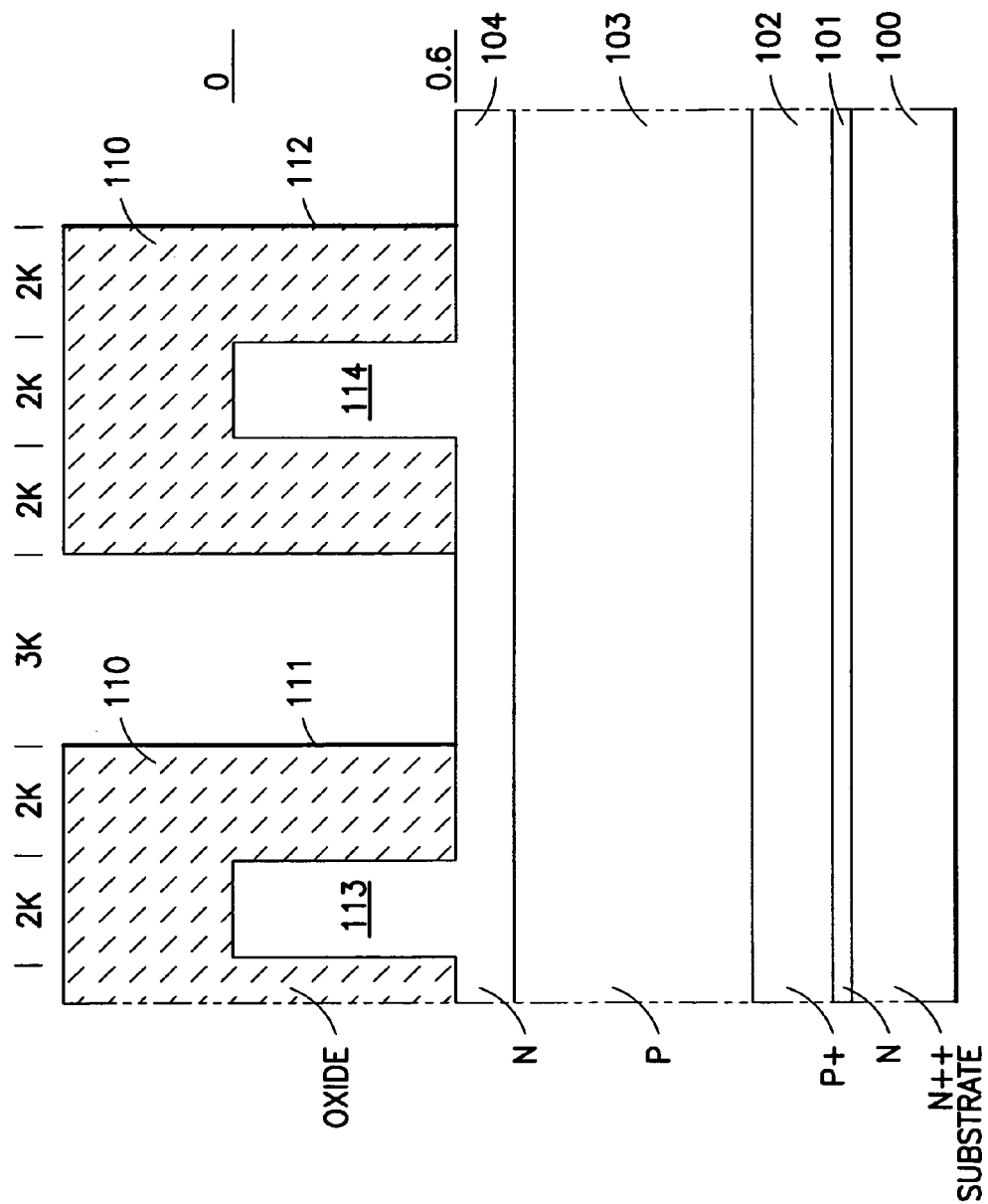
FIG. 2 shows a small portion of a starting wafer after initial process steps for a second embodiment of the invention and after a trench etch and a TEOS (oxide) deposition.

Referring first to FIG. 2, there is shown the starting N++ substrate 100 with initial process steps. Like the embodiment of FIG. 1, the substrate 100 has an N layer 101 on its top and a P+ layer 102 is atop layer 101. A P channel layer 103 is atop the channel contact layer 102 and an N+ type drift region 104 is atop layer 103. The thicknesses of the various layers stated above and in FIG. 1 are labeled in the right hand margin of the Figures in micrometers, and on the top margin in angstroms.

As a first major step in the sequence to prepare the wafer, and as shown in FIG. 2, an oxide 110 is grown atop the die top surface and a photolithographic step is carried out, ultimately ending in spaced trenches 111 and 112 extending into drift region 104 for a given depth, leaving oxide-covered mesas 113 and 114 in layer 104.

Figure 3:
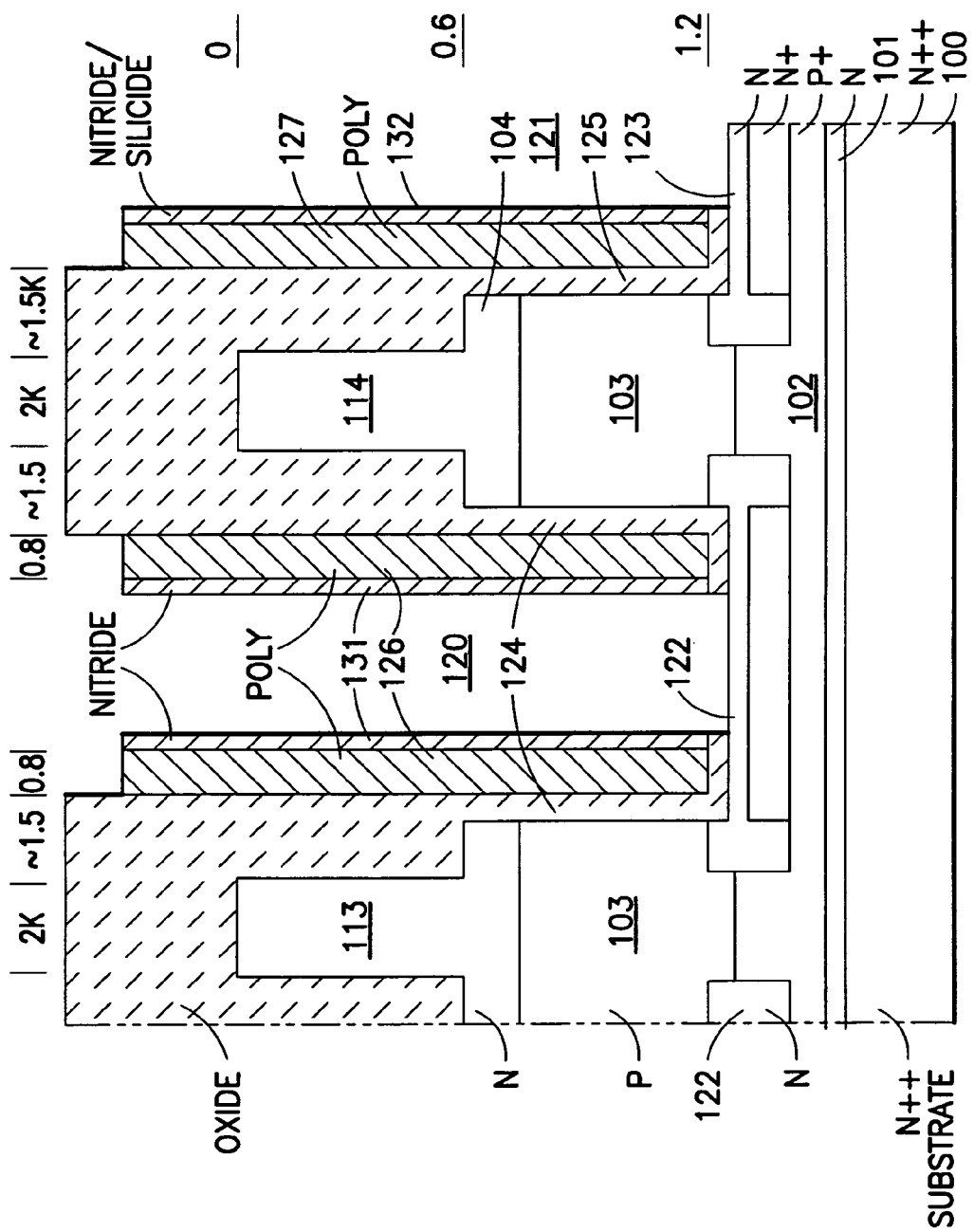
FIG. 3 shows the structure of FIG. 2 after a second trench etch, poly deposition and poly doping, a nitride deposition and a body short implant and drive.

Thereafter, and as shown in FIG. 3, there is a further trench etch, forming trenches 120 and 121 and an N type body short implants 122 and 123 are formed in the bottoms of trenches 120 and 121 respectively.

A gate oxide (450 Å) 124, 125 is then grown in trenches 120 and 121 respectively, and polysilicon masses 126 and 127 fill trenches 120 and 121 respectively. These masses 126 and 127 are then doped and made conductive and are then etched along their central lengths down to implants 122, 123 respectively.

Nitride layers 131 and 132 (150 Å) are then deposited into trenches 120 and 121 over the exposed walls of polysilicon gate masses 126 and 127. This is followed by a nitride and oxide etch to expose implants 122 and 123. Note that the implants (phosphorus) 122 and 123 can be carried out at this point, if desired, followed by a short drive.

Figure 4:
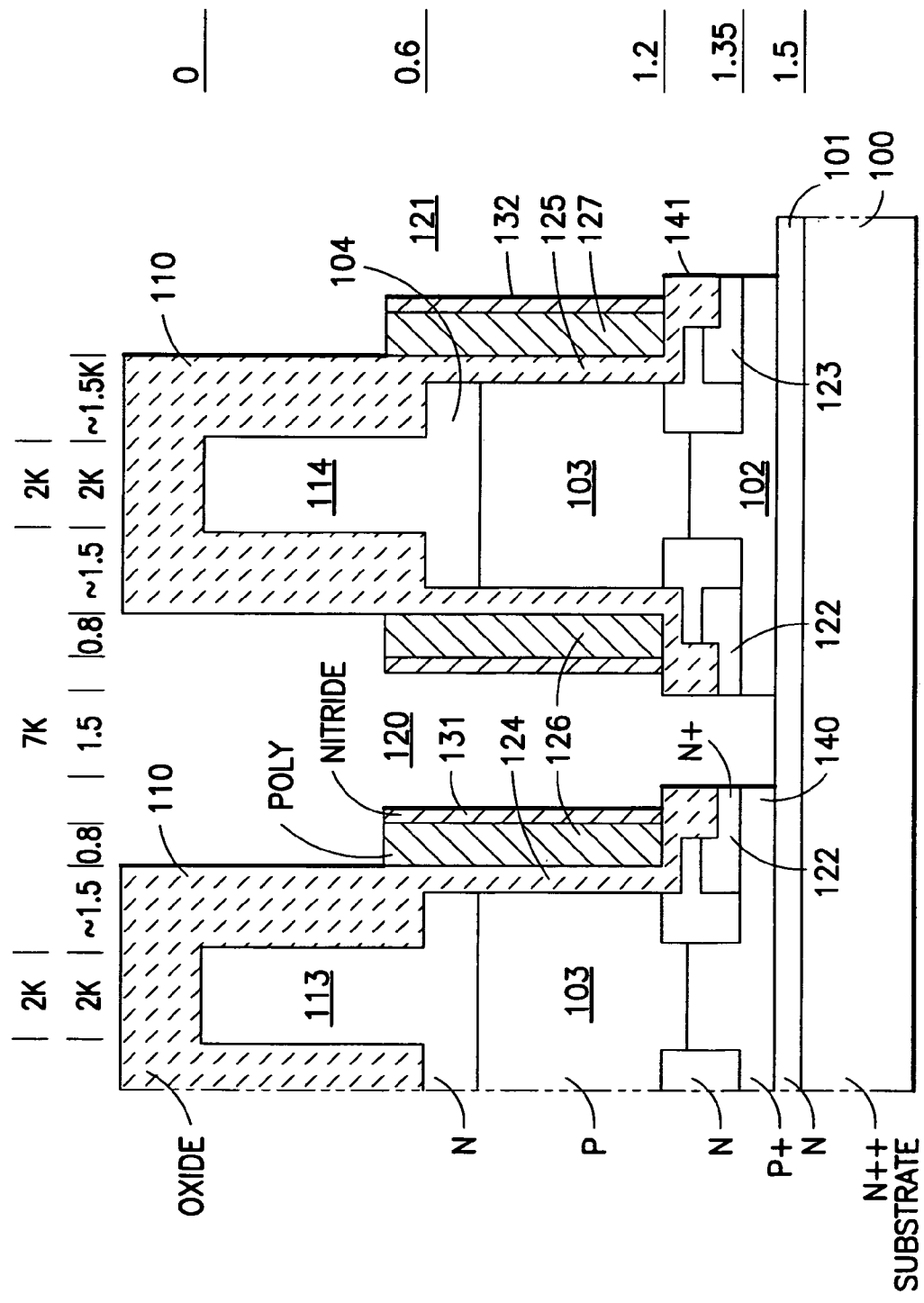
FIG. 4 shows the structure of FIG. 3 after a third trench etch and a body short oxide and drive.

Turning next to FIG. 4, a further trench etch is carried out, reducing the height of the polysilicon gates 126, 127; and opening windows 140, 141 in the bottom of trenches 120 and 121 to the N layer 101.

Figure 5:
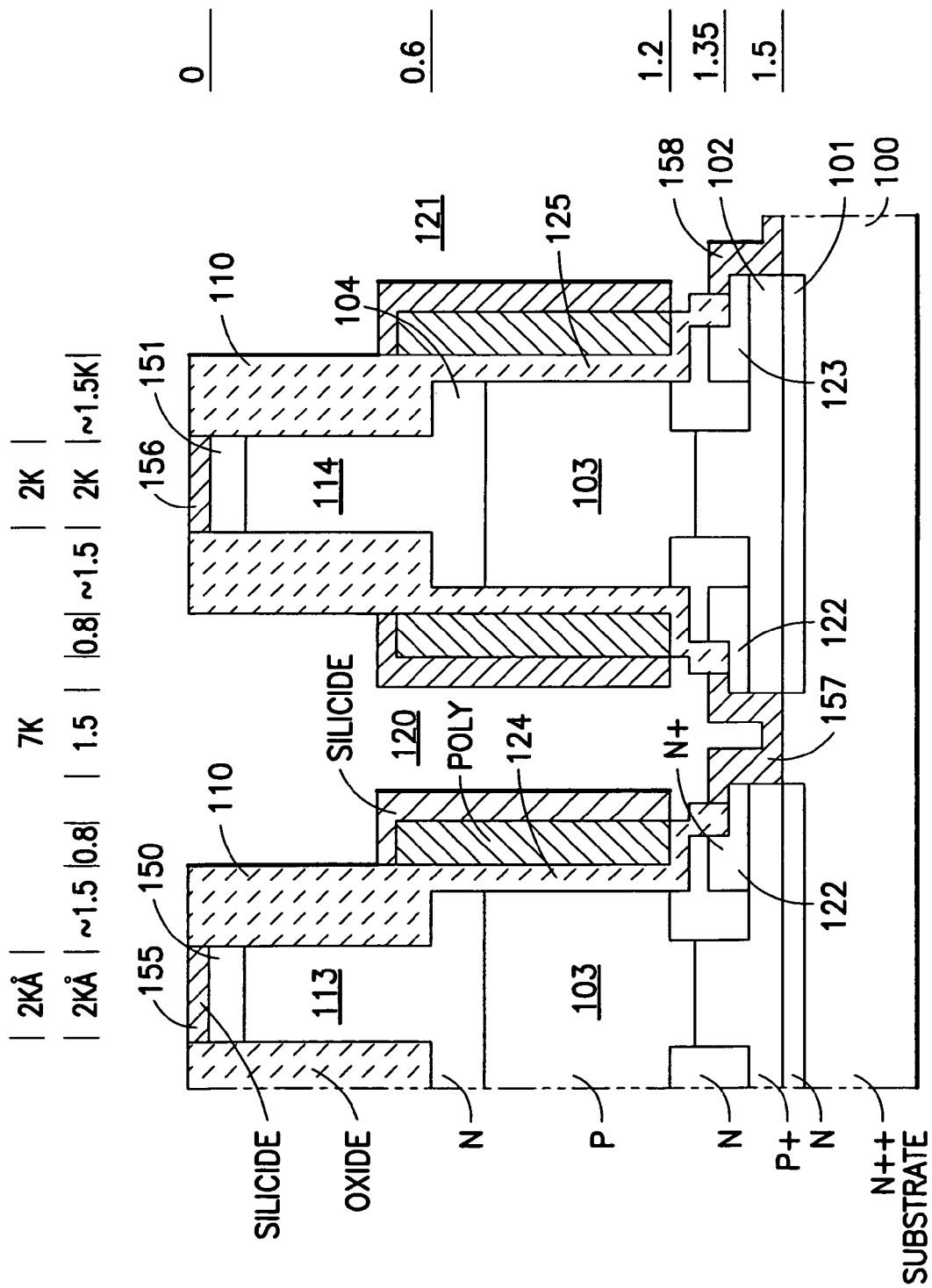
FIG. 5 shows the device of FIG. 4 after nitride removal; a mesa oxide etch; a source drain implant; a Ti deposition and rapid temperature anneal, and removal of metallic Ti, leaving a titanium silicide layer atop the N+ drain contact region and along the polysilicon gate and shorting the N+/P+ junction at the bottom of the trench.

Thereafter, and as shown in FIG. 5, the spacer nitride layers 131, 132 are removed and a mesa oxide etch is carried out, removing the oxide 110 down to the level of and coplanar with mesas 113 and 114. N$^+$ drain implants 150, 151 are then formed in the tops of N drift regions 113 and 114.

Titanium layers 155 and 156 are then deposited atop the drain implants 150, 151 respectively and, at the same time, titanium contact layers 157 and 158 are deposited at the bottoms of trenches 120 and 121, acting as body shorts in the same trench with the polysilicon gates. A rapid thermal anneal process is carried out and excess titanium is stripped, followed by a further rapid thermal anneal.

Thereafter, trenches 120 and 121 are filled with insulation (not shown); a drain contact (not shown) is formed on the die top and in contact with silicides 155 and 156; and a source contact (not shown) is deposited on the bottom of substrate 100.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A top drain MOSgated device, comprising a semiconductor die having a top and bottom surface comprising a substrate of a first conductivity type extending from said bottom surface; a first region of said first conductivity type over said substrate, a region of a second conductivity type over said first region of said first conductivity type; a channel region of said second conductivity type atop said region of said second conductivity type, said channel region being less conductive than said region of said second conductivity type; a drift region of said first conductivity type atop said channel region; a plurality of parallel spaced gate trenches extending from said top surface through said drift region, said channel region, said region of said second conductivity type and said first region of said first conductivity type; a second region of said first conductivity type formed adjacent each said gate trench and inside said region of said second conductivity type spaced from said first region by a portion of said region of said second conductivity type, a third region of said first conductivity type formed partially in said region of said second conductivity type and extending from said second region into said channel region; the bottom of each of said gate trenches having a conductive silicide short electrically connecting said substrate to said first region of said first conductivity type, said region of said second conductivity type, and said second region of said first conductivity type; a bottom insulating mass in the bottom of each of said gate trenches; a gate oxide liner lining the walls of each of said gate trenches adjacent at least a portion of a depth of said channel region; a conductive gate mass within each of said gate trenches and bounded on its bottom by said bottom insulating mass and at its sides by said gate oxide liner; a top insulation mass substantially filling a top of each of said gate trenches above the top of each of said conductive gate masses; and a top drain electrode disposed on said top surface and in contact with said drift region between said gate trenches; and a bottom source electrode connected to said bottom surface.

2. The device of claim 1, wherein said first conductivity type is an N type.

3. The device of claim 1, wherein said conductive gate mass is formed of conductive polysilicon.

4. The device of claim 1, which further includes a contact diffusion of increased concentration of carriers of said first conductivity type atop said drift region.

5. The device of claim 1, which further includes a conductive silicide layer atop said drift region.

* * * * *